United States Patent [19]

Koriyama

[11] Patent Number: 5,701,220
[45] Date of Patent: Dec. 23, 1997

[54] MAGNETIC DISK DRIVE

[75] Inventor: Hiroshi Koriyama, Tokyo, Japan

[73] Assignee: NEC Corporation, Tokyo, Japan

[21] Appl. No.: 453,103

[22] Filed: May 30, 1995

Related U.S. Application Data

[62] Division of Ser. No. 389,746, Feb. 14, 1995, which is a continuation of Ser. No. 993,851, Dec. 21, 1992, abandoned.

[30] Foreign Application Priority Data

Dec. 20, 1991 [JP] Japan .................................. 3-355195

[51] Int. Cl.$^6$ ........................................................ G11B 21/08
[52] U.S. Cl. ........................................................ 360/106
[58] Field of Search ...................... 360/97.01–97.04, 360/104–106; 361/397, 398, 399, 400, 414; 310/27, 36, 71

[56] References Cited

U.S. PATENT DOCUMENTS

| | | | |
|---|---|---|---|
| 4,464,842 | 8/1984 | Fish et al. | 344/344 |
| 5,095,396 | 3/1992 | Putnam et al. | 360/97.01 |
| 5,130,895 | 7/1992 | Somemiya et al. | 361/398 |
| 5,161,074 | 11/1992 | Forbord et al. | 360/97.01 |
| 5,170,300 | 12/1992 | Stefansky | 360/97.01 |
| 5,325,252 | 6/1994 | Yagi et al. | 360/97.01 |

FOREIGN PATENT DOCUMENTS 224980  9/1989  Japan ....................................... 360/104

*Primary Examiner*—John H. Wolff
*Assistant Examiner*—Allen Cao
*Attorney, Agent, or Firm*—Sughrue, Mion, Zinn, Macpeak & Seas, PLLC

[57] ABSTRACT

A magnetic disk drive capable of reducing the influence of a tension ascribable to the forming of a flexible printed circuit (FPC), which transfers the output signal of a magnetic head, on a carriage. The curved configuration and arrangement of the FPC are changed to minimize the tension ascribable to the FPC even when the carriage seeks the inner or outer peripheral portion of a magnetic disk.

3 Claims, 4 Drawing Sheets

MAGNETIC DISK DRIVE

This is a divisional of application Ser. No. 08/389,746 filed on Feb. 14, 1995, in turn a File Wrapper Continuation of Ser. No. 07/993,851 filed Dec. 21, 1992, now abandoned.

BACKGROUND OF THE INVENTION

The present invention relates to a magnetic disk drive and, more particularly, to a magnetic disk drive improved to reduce the influence of a tension ascribable to the forming of a flexible printed circuit, which transfers the output signal of a magnetic head, on a carriage.

A conventional magnetic disk drive has a carriage in the form of an arm and rotatably mounted on a shaft. A suspension is affixed to the free end of the carriage and in turn supports a magnetic head at the free end thereof. A coil assembly is affixed to the rear end of the carriage while a permanent magnet assembly is located to face the coil assembly. A control circuit positions the carriage which is rotated by an electromagnetic force generated between the coil assembly and the permanent magnet assembly. A flexible printed circuit (FPC) is connected at one end to the carriage and at the other end to the base of the disk drive for transferring the output signal of the head to the control circuit. The problem with the conventional magnetic disk drive is that the radius of curvature of the FPC noticeably changes depending on the position of the head in the radial direction of the disk. As a result, the tension acting on the FPC greatly changes. Since the tension acts on the carriage and constantly changes during the course of seek, even the servo loop fails to position the head with accuracy, resulting in a seek error or a read error.

SUMMARY OF THE INVENTION

It is, therefore, an object of the present invention to provide a magnetic disk drive in which the curved configuration and arrangement of an FPC are changed to reduce the tension (external force) ascribable to the PFC and acting on a carriage to a considerable degree so as to position the carriage with accuracy even when the carriage seeks the outer or inner peripheral portion of a magnetic disk, thereby eliminating seek errors and read errors.

In accordance with the present invention, a magnetic disk drive comprises a base, a magnetic head facing a magnetic disk, a suspension supporting the magnetic head, a movable carriage supporting the suspension, and an FPC affixed at one end to the carriage and at the other end to the base for transferring an output signal of the magnetic head to an external control circuit. The FPC includes a movable portion having a curvature provided with a spiral spring configuration which has substantially more than one turns.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
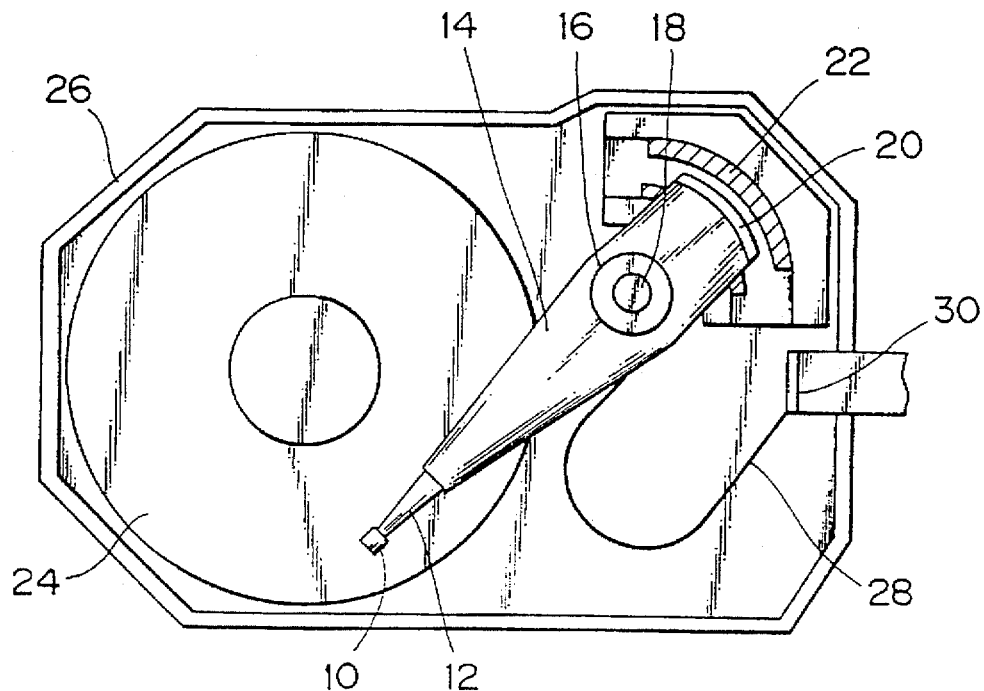
FIG. 1 is a plan view of a conventional magnetic disk drive.

To better understand the present invention, a brief reference will be made to a conventional magnetic disk drive, shown in FIG. 1. As shown, a magnetic head 10 is affixed to a suspension 12 which is in turn mounted on a carriage 14. The carriage 14 is mounted on a shaft 18 through a plurality of bearings 16 and rotated by an electromagnetic force acting between a coil assembly 20 and a permanent magnet assembly 22. The coil assembly 20 is affixed to the rear end of the carriage 14 while the magnet assembly 22 is located to face the coil assembly 20. The electromagnetic force is controlled in response to a seek command from the disk drive. The carriage 14 rotates about the shaft 18 in response to the seek command to bring the head 10 to a predetermined track on the surface of a magnetic disk 24.

It is a common practice to position the carriage 14 above the disk 24 by sensing positioning data recorded in a medium called a servo disk and which is a specific form of the disk 24 by a positioning head called a servo head. Specifically, the tracking of the head 10 is controlled by servo circuitry constituting a closed loop made up of a servo head position sensor, a voice coil motor control circuit constituted by the coil assembly 20 and magnet assembly 22, a circuit for feeding a current to the coil assembly 20, a circuit for moving the carriage 14, and a circuit for moving the servo head. After the servo head has been positioned, a magnetic head called a data head writes or reads data in or out of the disk 24. Such circuitry is generally located outside of a base 26 and receives a signal from the head 10 via a cable laid flexible printed circuit or FPC 28. The FPC 28 is affixed at one end to the carriage 14 and at the other end to the base 26 via a clamper 30.

Figure 2:
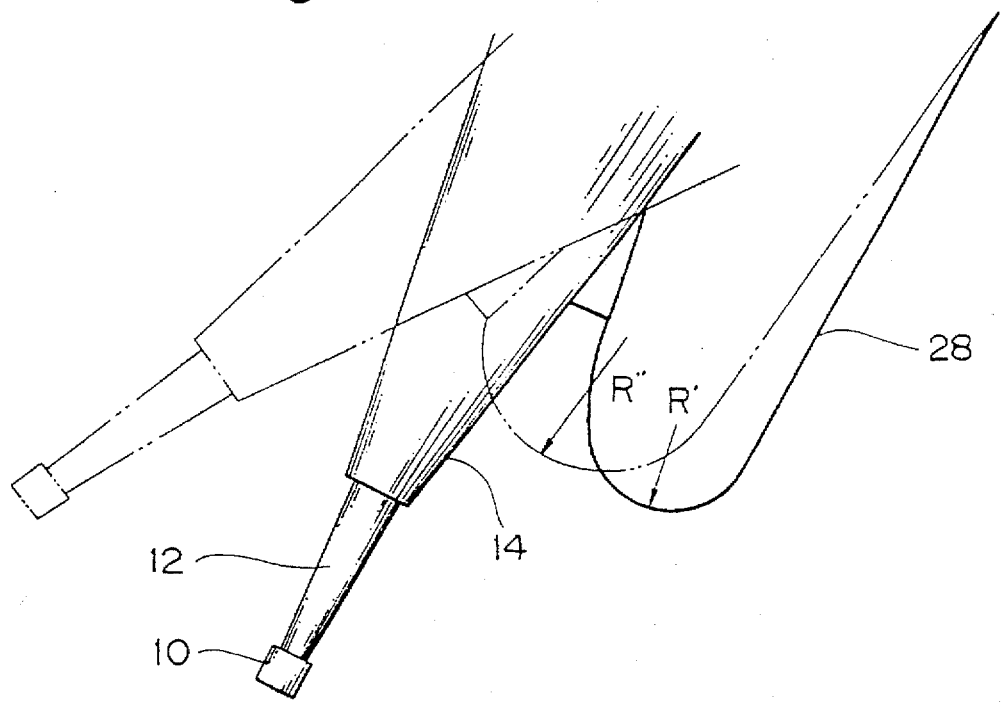
FIG. 2 demonstrates how the radius of curvature of an FPC included in the conventional disk drive changes during seeking.

The problem with the conventional magnetic disk drive i s that the radius of curvature of the FPC 28 noticeably changes depending on the position of the head 10. Specifically, as shown in FIG. 2, the FPC 28 has a radius of curvature R" when the head 10 is located at radially outer part of the disk 24 or a radius of curvature R' when it is located at radially inner part of the disk 24. As a result, the tension generated by the FPC 28 greatly changes. Since the tension acts on the carriage 14 and constantly changes during the course of seek, even the servo loop fails to position the head 10 with accuracy, resulting in a seek error or a read error.

Figure 3:
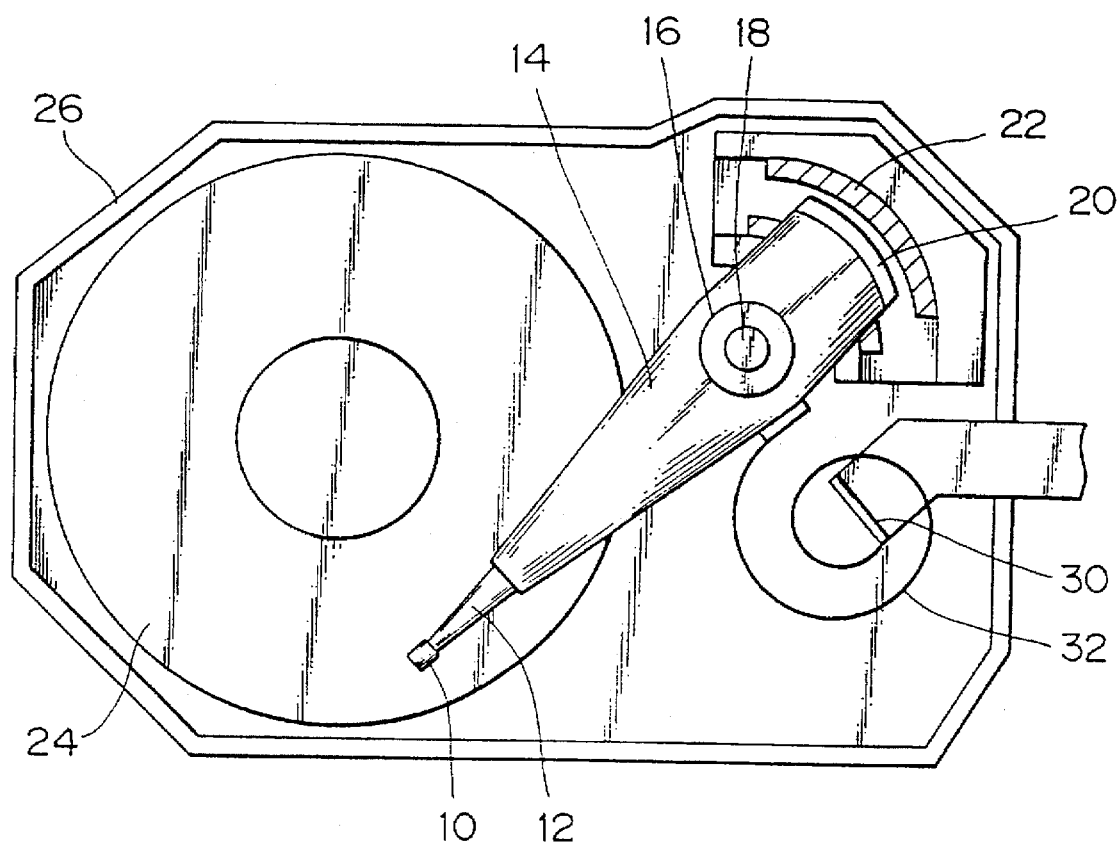
FIG. 3 is a plan view showing a magnetic disk drive embodying the present invention.

Referring to FIG. 3, a magnetic disk drive embodying the present invention is shown. In FIG. 3, the same or similar constituents to those shown in FIG. 1 are designated by like reference numerals, and a detailed description will not be made to avoid redundancy. The embodiment is characterized in that the movable portion of an FPC has a radius of curvature implemented spiral spring configuration having substantially more than one turns. Specifically, an FPC 32 transfers a signal from a magnetic head 10 to control circuitry, not shown, located outside of the base 26. The FPC 32 is affixed at one end to a movable carriage 14 and at the other end to the base 26. As the carriage 14 performs a seeking motion for writing or reading data, the movable portion of the FPC 32 deforms with a certain curvature. However, since the movable portion of the FPC 32 has substantially more than one turn in a spiral spring configuration, the tension generated by the FPC 32 due to the change in the radius of curvature, i.e., the external force exerted by the FPC 32 on the carriage 14 can be reduced, as follows.

Figure 4:
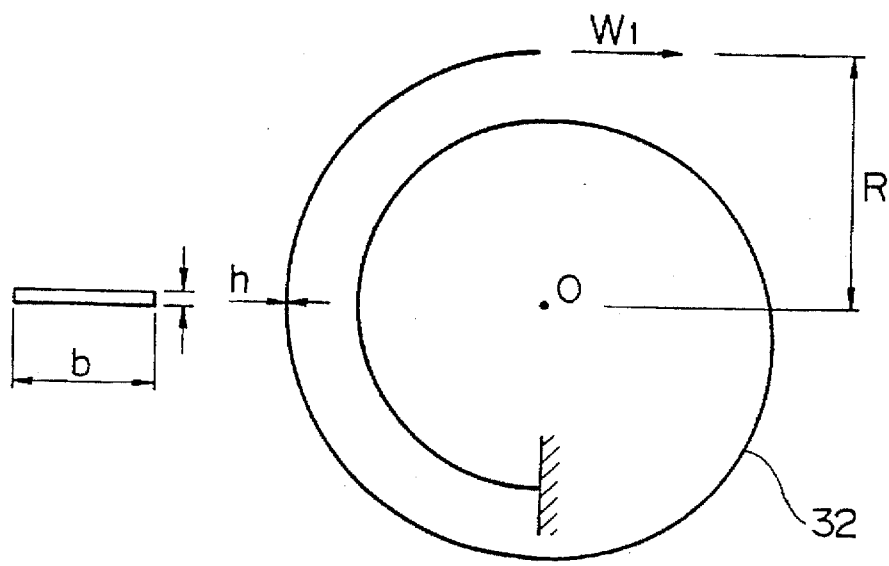
FIG. 4 schematically shows the forming of an FPC included in the embodiment.

As shown in FIG. 4, assume that the movable portion of the FPC 32 has a curved configuration in the form of a spiral spring having substantially more than one turn. Then, a load W1 acting on the carriage 14 is expressed as:

$$W1 = \delta \cdot b \cdot h^3 \cdot E/(12L \cdot R^2) \quad (1)$$

where δ is a flexure, b is the width of the FPC 32, E is the Young's modulus of the FPC 32, L is the length (overall height) of the FPC 32, and R is the radius of action.

Figure 5:
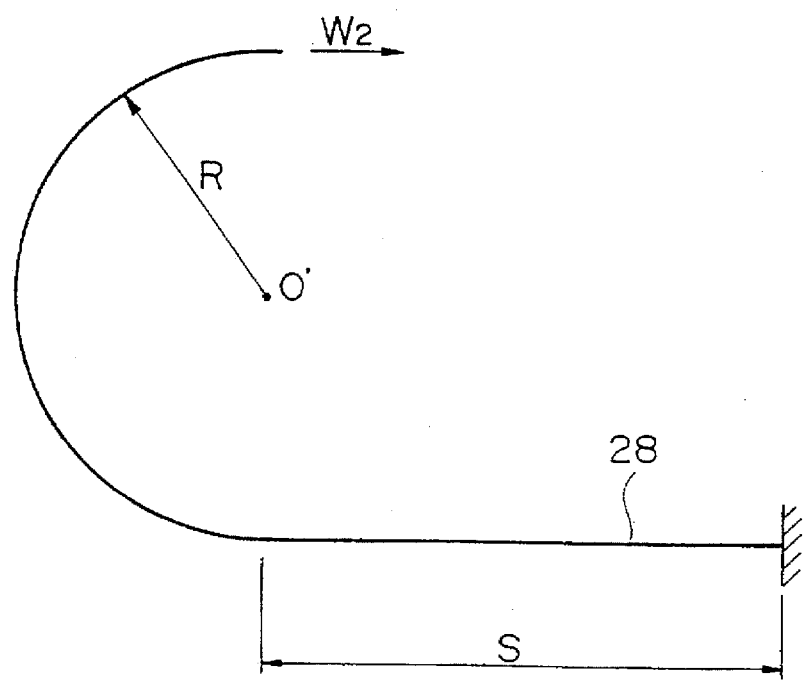
FIG. 5 schematically shows the forming of the conventional disk drive of FIG. 1.

FIG. 5 shows the configuration of the conventional FPC 28, FIGS. 1 and 2. In this case, a load W2 acting on the carriage 14 is produced by:

$$W2 = \delta \cdot b \cdot h^3 \cdot E/\{12(3\pi R/2 + 4S)/R^2\} \quad (2)$$

where S is the length of the FPC 28 (straight portion).

To reduce the external force acting on the carriage 14, reducing the load W1 or W2 will suffice. However, assuming that the seek angle is constant, then the equations (1) and (2) teach that δ is constant and, therefore, b·h·E should only be reduced or L·R and 3πR/2+4S should only be increased. The former (numerator) is the product of the width, thickness and Young's modulus of the FPC and cannot be excessively reduced due to the limitations relating to the number of heads, the minimum width of a pattern for signals, the tearing strength, material, etc. On the other hand, the latter (denominator) relates to the overall length of the FPC; the space for accommodating, among others, the conventional type of FPC increases when R and S are increased, particularly when S is increased.

The illustrative embodiment provides L corresponding to S with a spiral configuration and, therefore, allows it to have a great value without R being changed. This is successful in reducing the space for accommodating the FPC.

The conventional disk drive and the embodiment will be compared with respect to specific numerical values. Assume δ=20 (mm), b=30 (mm), h=0.2 (mm), E=250 (kg/mm²), L=300 (mm), and R=25 (mm). Then, W1 is 0.5 (g), and S should be 45.5 (mm). While the tension relates to the overall length of the FPC, increasing the overall length of the FPC directly translates into an increase in the space requirement. This is especially true with the conventional FPC 28. By contrast, the illustrative embodiment reduces the space requirement due to the spiral shape of the FPC 32. The decrease in external force enhances accurate positioning by the servo loop to thereby minimize the probability of seek error and read error.

Figure 6:
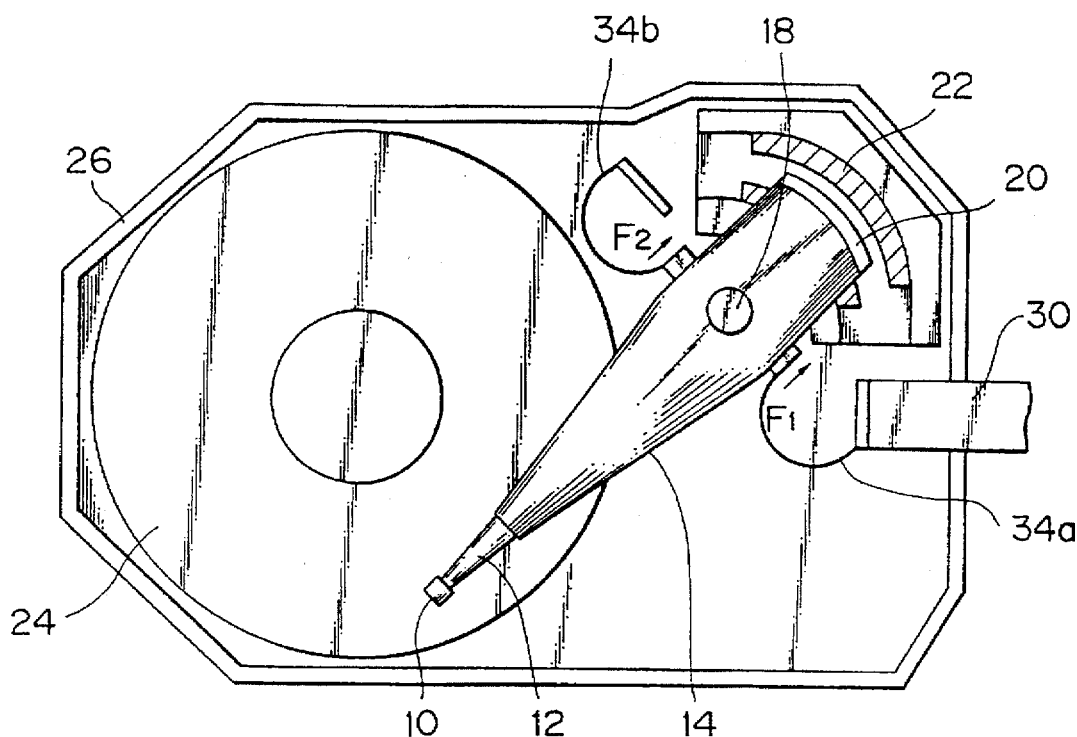
FIGS. 6 and 7 are plan views each showing an alternative embodiment of the present invention.

FIG. 6 shows an alternative embodiment of the present invention. As shown, FPCs 34a and 34b substantially identical in configuration are located at both sides of the carriage 14, so that tensions ascribable to the movement of the FPCs 34a and 34b may cancel each other. The FPCs 34a and 34b are each affixed at one end to the carriage 14 and at the other end to the base 26. As the carriage 14 performs a seeking motion, the FPCs 34a and 34b generate respectively tensions F1 and F2 due to the resulting changes in their curvatures. However, since the FPCs 34a and 34b are substantially identical in configuration and located at opposite sides of the carriage 14, the tensions F1 and F2 are different in polarity and substantially the same in value and, therefore, cancel each other.

Figure 7:
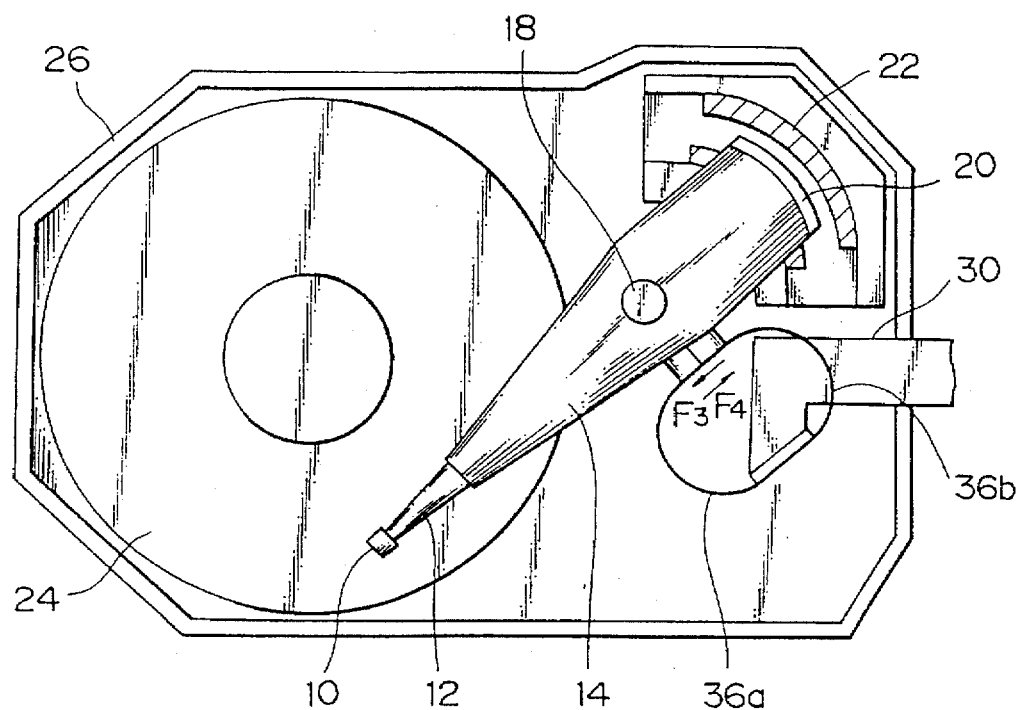

FIG. 7 shows another alternative embodiment of the present invention. As shown, FPCs 36a and 36b are located at one side of the carriage 14 like the conventional FPC 28. This embodiment is characterized in that the FPCs 36a and 36b have a substantially identical configuration and are positioned such that the tensions ascribable thereto cancel each other. Again, when the carriage 14 performs a seeking motion, the FPCs 36a and 36b generate respectively tensions F3 and F4 due to the changes in their curvatures. However, the tensions F3 and F4 cancel each other since the FPCs 36a and 36b are of substantially identical configuration.

Of course, the embodiments shown in FIGS. 6 and 7 may be combined to further reduce the tensions of the FPCs while the carriage 14 is in movement. Further, in FIGS. 6 and 7, one of the FPCs does not have to be provided with a capability of transferring signals from the head and may be simply implemented as a dummy FPC for correcting the tension.

In summary, in accordance with the present invention, an FPC is provided with a spiral configuration, or FPCs of substantially the same configuration are located at opposite sides of a carriage, or a plurality of FPCs having opposite and substantially equivalent curvatures are located at one side of the carriage. Hence, a tension ascribable to the movement of the FPC is reduced, or tensions cancel each other. This reduces an external force acting on the carriage to thereby enhance accurate positioning of a magnetic head by a servo loop. This implements a magnetic disk drive with a minimum of seek error and read error.

Various modifications will become possible for those skilled in the art after receiving the teachings of the present disclosure without departing from the scope thereof.

What is claimed is:

1. A magnetic disk drive comprising:
    a base;
    a magnetic head facing a magnetic disk;
    a suspension supporting said magnetic head;
    a pivotably movable carriage supporting said suspension; and
    a flexible printed circuit (FPC) affixed at one end to said pivotably movable carriage and at the other end to said base for transferring signals between said magnetic head and an external control circuit, an additional FPC of substantially identical configuration being located at the other side of said carriage such that tensions generated by said pair of opposed FPCs substantially cancel each other.

2. The magnetic disk drive defined in claim 1, wherein both of said FPCs transfer signals between said magnetic head and said external control circuit.

3. The magnetic disk drive defined in claim 1, wherein said FPCs are mounted to said pivotably movable carriage such that said carriage pivots at a point directly between said FPCs.

* * * * *